United States Patent [19]

Hall

[11] Patent Number: 5,245,242
[45] Date of Patent: Sep. 14, 1993

[54] EFFICIENCY DRIVER SYSTEM FOR PIEZOELECTRICS

[75] Inventor: James R. Hall, West Hills, Calif.

[73] Assignee: Rockwell International Corporation, Seal Beach, Calif.

[21] Appl. No.: 867,559

[22] Filed: Apr. 13, 1992

[51] Int. Cl.$^5$ .............................................. H01L 41/08
[52] U.S. Cl. ..................... 310/316; 310/317; 310/319
[58] Field of Search ....................... 310/316, 317, 319; 318/116

[56] References Cited

U.S. PATENT DOCUMENTS

| | | | |
|---|---|---|---|
| 2,694,779 | 11/1954 | Minnich | 310/317 X |
| 2,985,003 | 5/1961 | Gelfand et al. | 310/317 |
| 3,100,886 | 8/1963 | Marks | 310/317 |
| 3,585,405 | 6/1971 | Stettiner | 310/317 X |
| 3,800,170 | 3/1974 | Klein et al. | 310/317 X |
| 4,588,917 | 5/1986 | Ratcliff | 310/316 |
| 4,628,275 | 12/1986 | Skipper et al. | 330/10 |
| 4,947,074 | 8/1990 | Suzuki | 310/316 |

Primary Examiner—Mark O. Budd
Attorney, Agent, or Firm—H. Fredrick Hamann; Harry B. Field; Steven E. Kahm

[57] ABSTRACT

This invention drives a piezoelectric element by transferring energy from one element 5 to another 6 by way of an intermediate inductor 4. Additional energy is obtained from an energy source 1 to make up for internal losses and for the work performed by the piezoelectric elements. The energy is transferred as needed by switches which are operated by a controller for proper timing of energy transfer between the elements and energy boosts from the energy source.

8 Claims, 2 Drawing Sheets

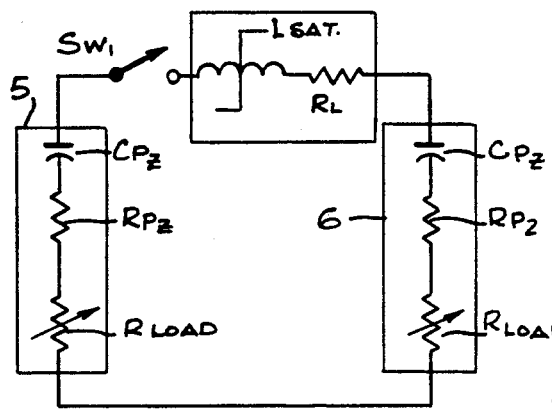
FIG. 4
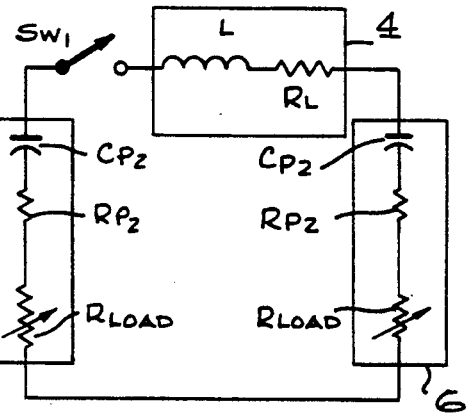
FIG. 6
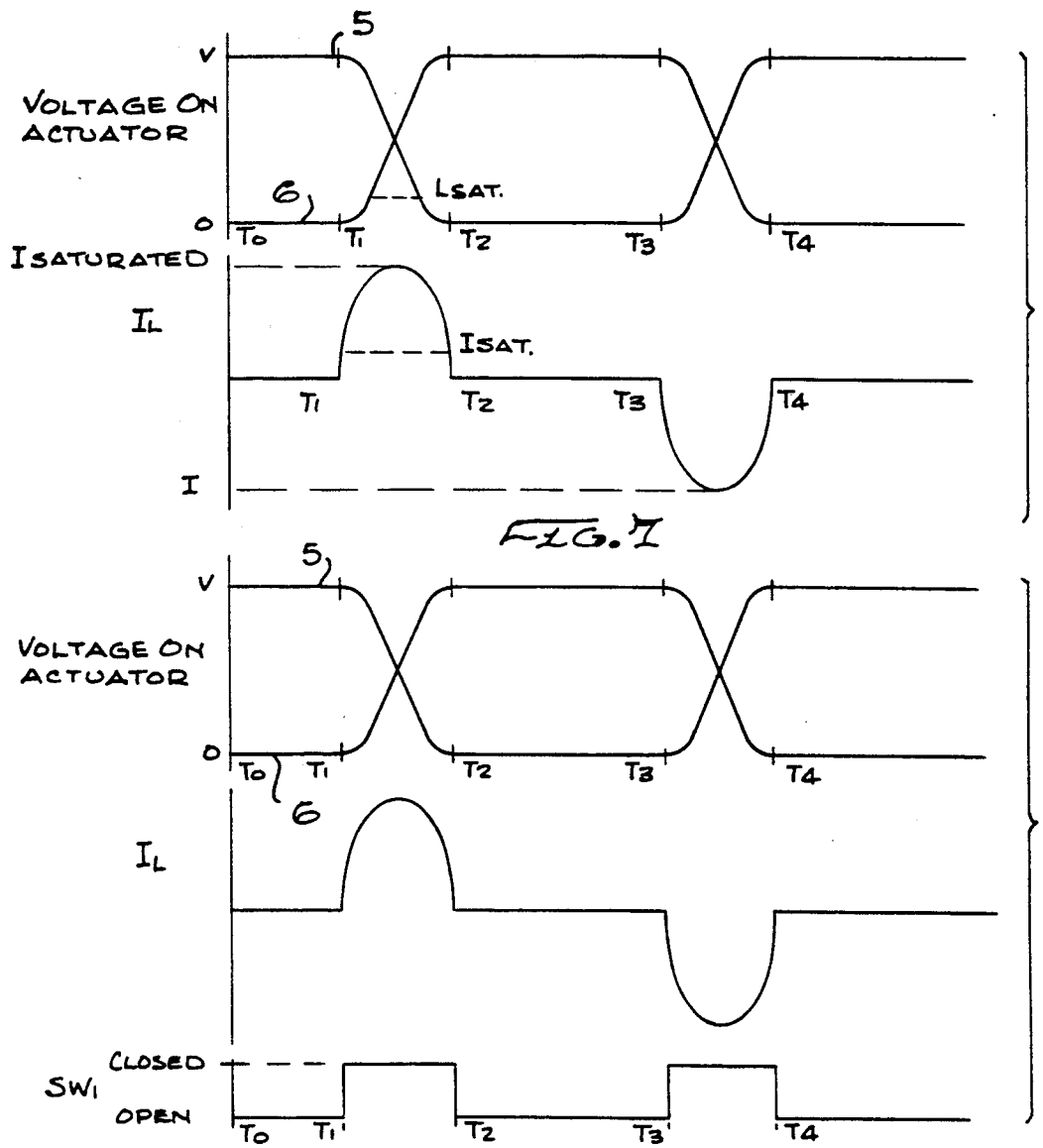
FIG. 5
FIG. 7

EFFICIENCY DRIVER SYSTEM FOR PIEZOELECTRICS

BACKGROUND OF THE INVENTION

1. Field of the Invention

This invention relates to electric drives for piezoelectric actuators and more particularly to energy transfer between two piezoelectric elements for increasing the system efficiency of operation.

2. Description of the Related Art

Piezoelectric actuators and other high-capacitive devices require high voltage drive. Driving them linearly with a conventional amplifier requires a large reactive current and results in correspondingly high losses.

Improvements have been made such as in Skipper U.S. Pat. No. 4,628,275 to provide efficient power amplifiers for such devices. However the capacitive energy stored in the actuator which is recaptured and used to reduce the energy requirements of the actuator systems is subject to the same losses during recovery as during the charge portion of the cycle.

SUMMARY OF THE INVENTION

This invention uses the capacitive energy stored in an activated piezoelectric actuator which is to be deactivated to activate a piezoelectric actuator which has little or no capacitive energy stored in it.

The energy of one capacitive actuator is switched through an inductor to a second actuator. The timing of the switching and the rate of transfer of energy are tailored to the functional needs of the actuator. Energy is added to the system from a voltage source to make up for the losses in the system and for the work done by the actuators.

OBJECTS OF THE INVENTION

It is one object of the invention to increase the efficiency of a piezoelectric actuator system by transferring capacitive energy from one actuator to another directly rather than discharging an actuator and sending the energy back to a power source energy store.

Other objects, advantages and novel features of the present invention will become apparent from the following detailed description of the invention when considered in conjunction with the accompanying drawings.

BRIEF DESCRIPTION OF THE DRAWINGS

FIG. 4 is a schematic of a portion of the invention in which a non linear inductor is used.

FIG. 5 is a graph of the voltage and current of the circuit of FIG. 4.

FIG. 6 is a schematic of a portion of the invention in which a linear inductor is used.

FIG. 7 is a graph of the voltage and current of the circuit of FIG. 6.

DETAILED DESCRIPTION OF THE PREFERRED EMBODIMENT

Electrodeformable materials such as piezoelectric material provide conversion of electrical energy to mechanical work. This work appears as electrical loads that are mainly capacitive in nature with the work energy being a small resistive component to the driver circuit. Charge must be transferred to the capacitor to produce motion resulting in work if the motion drives a mechanical load. If there is no mechanical load the energy from the charge transfer is stored in the capacitor to be recovered later when the charge is removed and the motion is reversed. With no mechanical load the losses are limited to the circuit losses plus the internal losses of the piezoelectric element. The electrical equivalent is shown in the figures wherein piezoelectric actuators 5 and 6 have a capacitor indicating that piezoelectric devices act as capacitors, a series variable resistance representing the mechanical load and a resistor to show a minimum value of resistance representing internal losses.

Typically piezoelectric materials can transfer 2-13% of the electrical energy they receive to useful work. This results in a large ratio of drive energy compared to work energy, and therefore could result in a very low efficiency system if great care is not exercised in the energy transfer and recovery circuitry in the driver to recapture energy stored in the material as capacitive energy.

As in all high efficiency capacitor charging systems the circuit must have minimum resistive losses in the controlling switching elements and the inductor.

Figure 1:
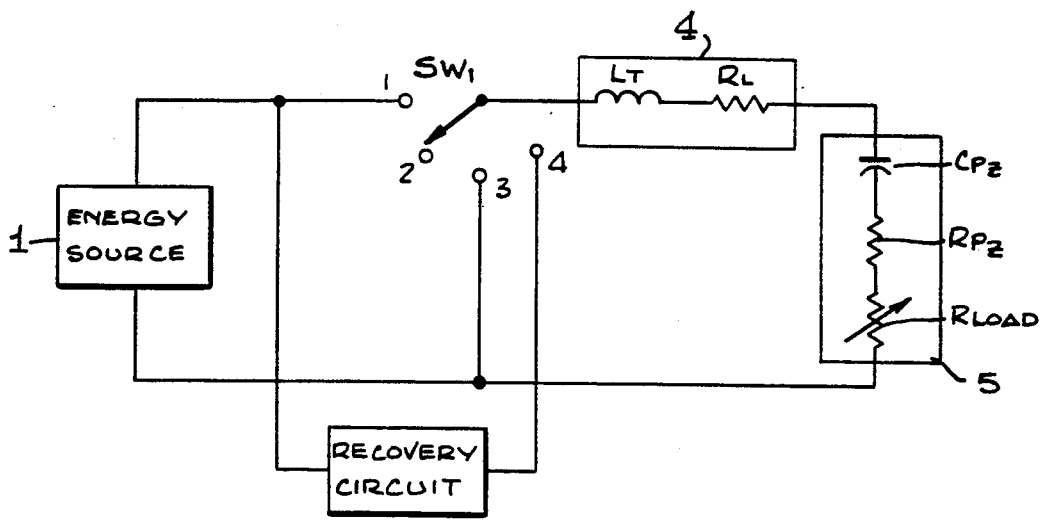
FIG. 1 is a schematic view of the related art having a piezoelectric actuator which returns its capacitive energy to the energy source.

A typical LC charging system is shown in FIG. 1. Energy is transferred from the energy source 1 to the actuator 5 through inductor 4 by moving switch Sw1 to position 1. Current magnitude and the resulting charge rate is controlled by alternating Sw1 from position 1 to 3 so that average applied voltage and average current produce the charge rate.

When the desired charge voltage (or current time product) is achieved the switch may be moved to position 2 to hold the charge.

To remove the charge, Sw1 can be moved to position 4 so that energy recovery may be achieved by returning the stored energy to the source.

There are many variations of recovery circuits, all of which have to overcome the problem where both the charge and recovery portions of the cycle are subject to the loss of energy during transfer in the inductor and switching elements.

A typical system consisting of an energy source, switch elements, and transfer inductor might achieve efficiencies of 0.9 to 0.95 if carefully designed. Assuming a piezoelectric transfer efficiency of 0.05 the overall system efficiency $n_s$ may be calculated.

$$n_s = \text{Energy Load}/(\text{Energy loss} + \text{Energy Load})$$

Where
Energy Load = $E_L$ = 0.05 $E_c$.
$E_c$ = Charge Energy
Energy loss = $E_1$ = (1 − 0.92) $E_c$ The energy loss occurs on both charge and recovery therefore $$n_s = \frac{0.05 \, E_c}{[2(1 - 0.092) E_c + 0.05 \, E_c]}$$
$$= \frac{0.05}{(0.16 + 0.05)}$$
$$= 0.24$$

Thus with 92 percent efficient circuitry and a lossless piezo element only 24% system efficiency is realized because of the large circulating energy which is subject to circuit losses.

In some actuators layers of piezoelectric material are stacked and each layer driven by a different wave form such that mechanical summing of the layers results in a desired actuator movement. For a complete explanation see Rockwell International Corporation's copending patent application Ser. No. 07/743,069 filed Aug. 9, 1991 which is a continuation of Ser. No. 07/488,548 filed Mar. 5, 1990 for an Electrical Drive for a Segmented Transducer which is hereby made a part hereof and incorporated herein by reference.

In some actuator designs such as those found in U.S. Pat. No. 4,928,030, for a Piezoelectric Actuator issued May 22, 1990, U.S. Pat. No. 5,017,820 for a Piezoelectric Rotary Union System issued May 21, 1991 and U.S. Pat. No. 5,068,566 for an Electric Traction Motor issued Nov. 26, 1991 all of which are made a part hereof and incorporated herein by reference, multiple pairs of actuators operate in smooth walking motion to alternately contact and move objects. These actuators are particularly receptive of the present invention because one actuator is being discharged while an adjacent actuator is being charged.

Figure 2:
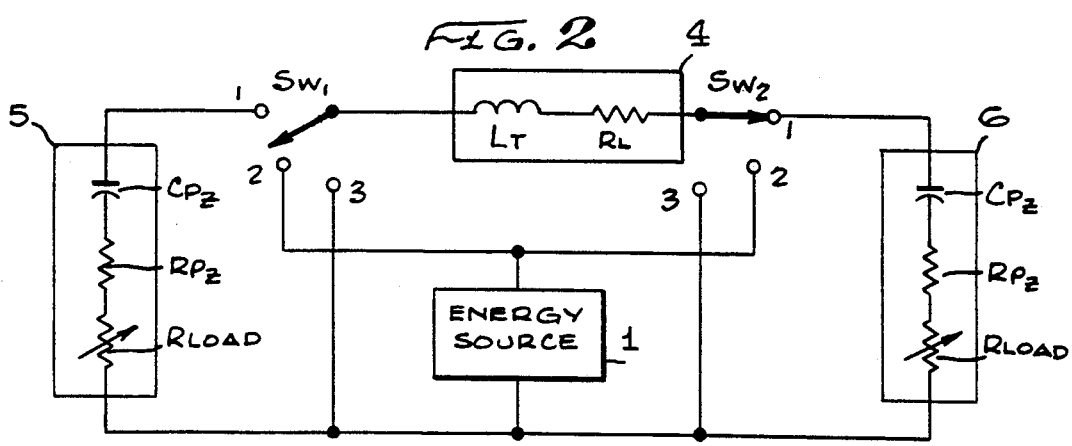
FIG. 2 is a schematic view of one embodiment of the invention where the capacitive energy stored in one piezoelectric actuator is used to activate a second piezoelectric actuator.

FIG. 2 shows that a significant system efficiency improvement can be achieved by having two or more actuators which work alternately so that the energy from one actuator is transferred directly to a second actuator.

As an example, assume that in the initial condition piezoelectric actuator 5 is fully charged and piezoelectric actuator 6 has zero charge.

Switch 2 is in position 1 connecting piezoelectric actuator 6 to the transfer inductor 4 and switch 1 is alternated between position 1 and 3, by a controller, to transfer energy from piezoelectric actuator 5 through transfer inductor 4 to piezoelectric actuator 6 at the desired rate. In this configuration the energy transfer will allow the charges to equalize the voltage on the piezoelectric actuators.

If switch 2 remains in position 1 until the current rises in sinusoidal manner to the peak value determined by $$\frac{V}{\sqrt{(L/C)}}$$

and decays to zero, all charge will transfer from piezoelectric actuator 5 to piezoelectric actuator 6. Switch 2 can then be moved to position 3 for isolating the charge on piezoelectric actuator 6.

During this process piezoelectric actuator 5 moves to its rest state and piezoelectric actuator 6 moves to its stressed state.

Since the transfer of energy results in some loss, and since additional energy loss occurs if piezoelectric actuator 6 is doing some work, the energy in the system would be depleted to zero after several transfers. However additional energy may be added to the system by utilizing position 2 of the control switches 1 and 2, to introduce additional energy from the source to make up for the losses.

If the sinusoidal transfer of charge current is not desirable because of the required motion of the piezoelectric actuators, an alternate operating mode where both switch 1 and switch 2 alternately transfer between positions 1 and 3, the energy will flow piece wise from piezoelectric actuator 5 to piezoelectric actuator 6 by moving from the electrostatic field of the piezoelectric actuators to the electromagnetic field of the inductor and then to the electrostatic field of the second piezoelectric actuator.

The limitation of using identically reversed wave forms to charge and discharge the piezoelectric actuator pairs has eliminated transferring all of the recovered energy to the source and then to the other piezoelectric actuator, and the transfer losses are approximately halved. The net efficiency for the system is approximately $$n_s = \frac{0.05 \, E_c}{[(1 - 0.092) E_c + 0.05 \, E_c]}$$
$$= \frac{0.05}{(0.08 + 0.05)}$$
$$= 0.38$$

which is 1.6 times the previous value.

Many LC energy transfer configurations using both linear and non linear inductive elements may be implemented, but the efficiency of the system always improves if the circulating energy moves between the piezoelectric actuators with the fewest intermediate energy storage elements and switches.

Figure 3:
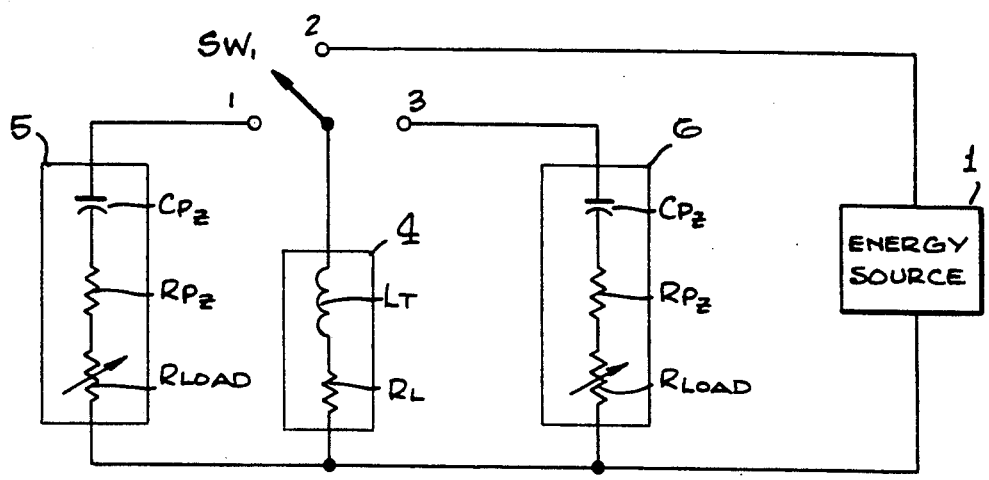
FIG. 3 is a schematic of a second embodiment of the invention.

In the embodiment shown in FIG. 3, current from the energy source 1 charges the inductor 4, which is then transferred to one or the other piezoelectric actuators 5 or 6, until the desired charge (and charge rate is achieved) then the energy is transferred from piezoelectric actuator 5 to piezoelectric actuator 6 and back as required, with occasional supplements from the energy source to make up losses and supply the energy required by the work being done.

Many inductor circuits may be used in the above design. By way of example FIGS. 4 and 6 show two inductor circuits which may be used.

An example of a non linear inductor (saturable reactor) transfer circuit which produces an oscillatory wave form which is a pseudo square wave is shown in FIG. 4, where piezoelectric actuators 5 and 6 are of equal capacitance and the transfer inductor 4 is a saturable inductor with values of L unsaturated and L saturated.

As the chart in FIG. 5 shows, piezoelectric actuator 5 is charged and piezoelectric actuator 6 is at zero charge when Switch 1 is closed to start the cycle at time zero. Current slowly rises in inductor 4 until current saturation, when the volt second rating of the inductor is reached. When the inductor saturates the circuit impedance rapidly drops to a new value determined by L saturation. A sinusoidal current then flows from piezoelectric actuator 5 through the conductor to piezoelectric actuator 6 during the period from $T^1$ to $T^2$. When the current drops to zero the inductor unsaturates. During the period from $T^2$ to $T^3$ piezoelectric actuator 6 is charged, piezoelectric actuator 5 has zero charge and the low frequency transfer of charge from piezoelectric actuator 6 to piezoelectric actuator 5 begins. The current magnitude is determined by L unsaturated as is the oscillatory frequency. As the current slowly increases the I saturation value is reached in V×t time, the inductor saturates in the other end of the B H loop and rapid retransfer of the charge occurs. The transfer time is controlled by L saturation and the hold time by L unsaturation. The rest of the hold time can be extended by opening switch 1 when the current is at zero. The combination of the saturable inductor with a switch for controlled hold times results in less stress on the switch compared to using a fixed inductor and switch since the large value of L unsaturated reduces di/dt after the switch closure and allows time to complete the switch closure function before large current values flow. The fixed inductor circuit in FIG. 6 does not have the slowly changing current (representing the longer time constant of $t = \sqrt{L \text{ unsaturated} \times Cpz}$) between charge transfer pulses as shown in FIG. 7.

Many other combinations of multiple switches, inductors, or nonlinear inductors may be used to produce variations charging current wave forms to produce desired motions of the piezoelectric actuators, but if the devices are operated with complementary motions so that the energy stored in each half of the system can be transferred to the other half without returning it to the source the transfer losses can be minimized and higher system efficiency will be achieved.

The controller for operating the switches can have sensors on the piezoelectric elements and on the inductor to tell the controller what the state of the element or inductor is as well as providing information as to the position of the actuator.

Obviously, many modifications and variations of the present invention are possible in light of the above teachings. It is therefore to be understood that, within the scope of the appended claims, the invention may be practiced otherwise than as specifically described.

What is claimed and desired to be secured by Letters Patent of the United States is:

1. A driver system for transferring charge between piezoelectric elements comprising,
   a first piezoelectric element,
   a second piezoelectric element,
   an inductor connected between the first and second piezoelectric elements,
   a connection between the first and second piezoelectric elements to complete a circuit
   a switch for opening and closing the circuit
   a means for controlling the switch position.

2. A driver system for transferring charge between piezoelectric elements as in claim 1 wherein the inductor is a saturable inductor for transferring non linear wave forms.

3. A driver system for transferring charge between piezoelectric elements as in claim 1 wherein there is a means of adding energy to the system from an energy source.

4. A driver system for transferring charge between piezoelectric elements as in claim 2 wherein there is a means of adding energy to the system from an energy source.

5. A driver system for transferring charge between piezoelectric elements comprising,
   a first piezoelectric element,
   a second piezoelectric element,
   a first switch and a second switch,
   an inductor connected between the first and second piezoelectric elements, wherein the first switch is between the first piezoelectric element and the inductor and the second switch is between the inductor and the second piezoelectric element,
   an energy source,
   wherein the energy source, the first piezoelectric element and the second piezoelectric element have a common ground connection,
   wherein the switches can select if the inductor is connected to the energy source the piezoelectric actuator, or the common ground connection,
   a means for controlling the switch positions of the switches for transferring energy between the piezoelectric elements and adding energy from the energy source.

6. A driver system for transferring charge between piezoelectric elements as in claim 5 wherein the inductor is a saturable inductor for transferring non linear wave forms.

7. A driver system for transferring charge between piezoelectric elements comprising,
   a first piezoelectric element,
   a second piezoelectric element,
   an inductor,
   an energy source, and
   a switch,
   wherein the first and second piezoelectric elements, the inductor and the energy source all have a common ground connection and wherein the switch alternately connects the inductor to the first piezoelectric element the second piezoelectric element or the energy source,
   a means for controlling the switch position of the switch for transferring energy between the piezoelectric elements and adding energy from the energy source.

8. A driver system for transferring charge between piezoelectric elements as in claim 7 wherein the inductor is a saturable inductor for transferring non linear wave forms.

* * * * *